United States Patent
Lee et al.

(10) Patent No.: US 9,786,555 B1
(45) Date of Patent: Oct. 10, 2017

(54) METHOD FOR REDUCING CONTACT RESISTANCE

(71) Applicant: The Industry & Academic Cooperation in Chungnam National University (IAC), Daejeon (KR)

(72) Inventors: Hi Deok Lee, Daejeon (KR); Meng Li, Chungcheongbuk-do (KR); Geon Ho Shin, Daejeon (KR); Jeongchan Lee, Chungcheongnam-do (KR)

(73) Assignee: THE INDUSTRY & ACADEMIC COOPERATION IN CHUNGNAM NATIONAL UNIVERSITY (IAC), Daejeon (KR)

( * ) Notice: Subject to any disclaimer, the term of this patent is extended or adjusted under 35 U.S.C. 154(b) by 0 days.

(21) Appl. No.: 15/430,913

(22) Filed: Feb. 13, 2017

(30) Foreign Application Priority Data

Apr. 12, 2016 (KR) .......................... 10-2016-0045044

(51) Int. Cl.
*H01L 21/28* (2006.01)
*H01L 21/768* (2006.01)
*H01L 21/285* (2006.01)

(52) U.S. Cl.
CPC .. *H01L 21/76886* (2013.01); *H01L 21/28568* (2013.01); *H01L 21/28575* (2013.01); *H01L 21/76895* (2013.01)

(58) Field of Classification Search
CPC ......... H01L 21/76886; H01L 21/76895; H01L 21/28568; H01L 21/28575
See application file for complete search history.

(56) References Cited

FOREIGN PATENT DOCUMENTS

| KR | 10-2002-0002665 A | 1/2002 |
| KR | 10-2011-0102893 A | 9/2011 |

OTHER PUBLICATIONS

Li et al,"reduction of contact resistance Ni—InGaAlAs and n—InGaAs by GeSb" Applied Physcis Express 10 041201(2017) pp. 041201-1 to 041201-3.*

* cited by examiner

*Primary Examiner* — Savitr Mulpuri
(74) *Attorney, Agent, or Firm* — Carter, DeLuca, Farrell & Schmidt, LLP (57) ABSTRACT

Disclosed is a method for reducing contact resistance, including depositing a GST layer on an InGaAs substrate, generating an InGaAs/GST/Ni stacked structure by depositing a Ni layer on the GST layer, and thermally treating the stacked structure to rearrange components of the GST layer and to generate a Ni—InGaAs alloy.

11 Claims, 7 Drawing Sheets

METHOD FOR REDUCING CONTACT RESISTANCE

CROSS-REFERENCE TO RELATED APPLICATIONS

A claim for priority under 35 U.S.C. §119 is made to Korean Patent Application No. 10-2016-0045044 filed Apr. 12, 2016, in the Korean Intellectual Property Office, the entire contents of which are hereby incorporated by reference.

BACKGROUND

Embodiments of the inventive concept described herein relate to a method for reducing contact resistance by using a GST layer.

Along the gradual scaling-down of semiconductor devices in the past years, those devices are eventually meeting physical limits in improving their functionality. In other words, since the traditional Si-based device fabrication technology has come to be hardly regarded as providing more functional semiconductor devices, many efforts are going to find the next-generation high performance devices.

For example, the III-V compound semiconductors such as GaAs, AlGaAs, and InGaAs are recently used even for fabricating the semiconductor devices such as Field Effect Transistors (FET), High Electron Mobility Transistors (HEMT), and Hetero Junction Bipolar Transistors (HBT). Among them, InGaAs is spotlighted as a prospective one for a new substrate material.

In employing a new-generational high performance device, it is necessary to prepare very low resistance at junctions between metals and a substrate. A self-aligned Ni—InGaAs may provide several advantages in overcoming the issue about contact resistance. Therefore, many laboratories and companies are actively proceeding to find methodologies for reducing contact resistance by utilizing Ni—InGaAs.

SUMMARY

Embodiments of the inventive concept provide a method for reducing contact resistance of Ni—InGaAs by thermally treating a GST stacked structure.

According to an aspect of the inventive concept, a method for reducing contact resistance includes depositing a GST layer on an InGaAs substrate, generating an InGaAs/GST/Ni stacked structure by depositing a Ni layer on the GST layer, and thermally treating the stacked structure to rearrange components of the GST layer and to generate a Ni—InGaAs alloy.

According to an embodiment, the thermally treating of the stacked structure may include thermally treating the stacked structure to distribute the components of the GST layer with the highest value in a depth equal to or narrower than 30 nm from a surface of the stacked structure.

According to another embodiment, the thermally treating of the stacked structure may include thermally treating the stacked structure to make the components of the GST structure occupy an amount equal to or larger than 2% of other components in a depth equal to or narrower than 30 nm from the surface of the stacked structure.

According to another embodiment, the thermally treating of the stacked structure may include thermally treating the stacked structure for a time equal to or longer than 20 seconds and equal to or shorter than 40 seconds at temperature equal to or higher than 250° C. and equal to or lower than 350° C.

According to another embodiment, the GST layer may be formed of $Ge_2Sb_2Te_5$.

According to another embodiment, the GST layer may be formed of $Ge_XSb_YTe_Z$ where X, Y, and Z are integers equal to or larger than 1 and equal to or smaller than 50.

According to another embodiment, the GST layer may have a thickness equal to or larger than 3 nm and equal to or smaller than 7 nm.

According to another embodiment, the Ni layer may have a thickness equal to or larger than 12 nm and equal to or smaller than 18 nm.

According to another embodiment, the GST layer and the Ni layer may have thicknesses equal to or larger than 1 nm and equal to or smaller than 1,000 nm.

According to another embodiment, the thicknesses of the GST layer and the Ni layer may be formed in a ratio of 1:3.

BRIEF DESCRIPTION OF THE FIGURES

The above and other objects and features will become apparent from the following description with reference to the following figures, wherein like reference numerals refer to like parts throughout the various figures unless otherwise specified.

DETAILED DESCRIPTION

Hereinafter, embodiments of the inventive concept will be described in conjunction with the accompanied figures. The embodiments herein are merely proposed to help those skilled artisans easily practice them and may not act to restrict the scope of the inventive concept. Additionally, in describing these embodiments, the elements having the same technical properties will be indicated by the same reference numerals or marks.

Figure 1:
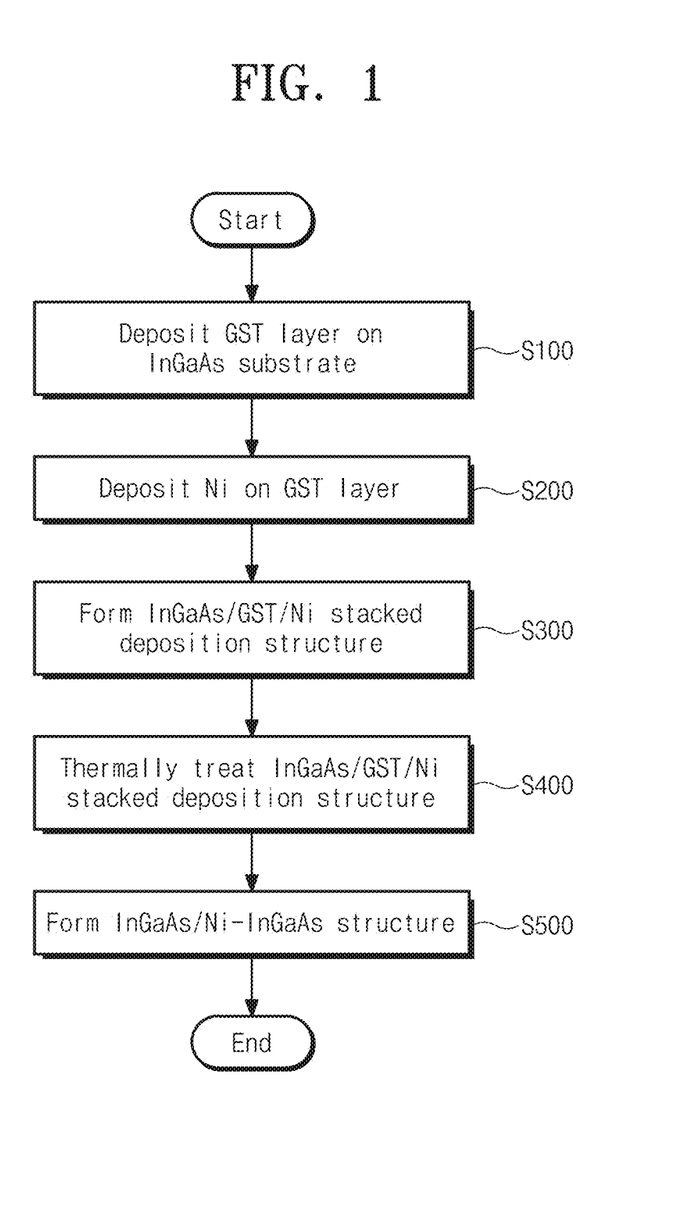
FIG. 1 is a flow chart showing a method for reducing contact resistance according to an embodiment of the inventive concept.
Figure 2:
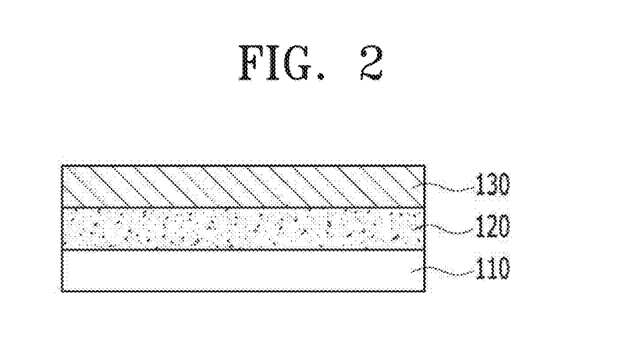
FIG. 2 is a diagram illustrating an InGaAs/GST/Ni stacked deposition structure according to an embodiment of the inventive concept.
Figure 3:
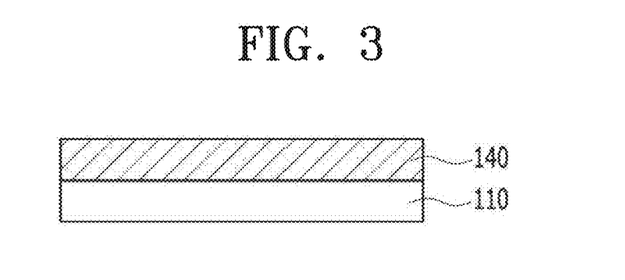
FIG. 3 is a schematic diagram illustrating an InGaAs/Ni—InGaAs structure according to an embodiment of the inventive concept.

FIG. 1 is a flow chart showing a method for reducing contact resistance according to an embodiment of the inventive concept, FIG. 2 is a diagram illustrating an InGaAs/GST/Ni stacked deposition structure according to an embodiment of the inventive concept, and FIG. 3 is a schematic diagram illustrating an InGaAs/Ni—InGaAs structure according to an embodiment of the inventive concept.

Referring to FIGS. 1 to 3, a method for reducing contact resistance according to an embodiment of the inventive concept may include the operations of depositing a GST layer 120 on an InGaAs substrate 110 (S100); depositing a Ni layer 130 on the GST layer 120 (S200); forming an InGaAs/GST/Ni stacked structure (S300); thermally treating the InGaAs/GST/Ni stacked deposition structure (S400); forming an InGaAs/Ni—InGaAs structure (S500).

In operation S100 of depositing the GST layer 120 on the InGaAs substrate 110, a sputter may be used to deposit a $Ge_XSb_YTe_Z$ layer, which is formed of Ge, Sb, and Te, on the InGaAs substrate 110. Here, X, Y, and Z are integers equal to or larger than 1 and equal to or smaller than 50, and the GST layer 120 may have a thickness equal to or larger than 1 nm and equal to or smaller than 1,000 nm.

In the operation S200 of depositing the Ni layer 130 on the GST layer 120, the $Ni/Ge_XSb_YTe_Z$ stacked layer may be formed by depositing the Ni layer 130 on the GST layer 120. The Ni layer 130 may have a thickness equal to or larger than 1 nm and equal to or smaller than 1,000 nm.

The Ni layer 130 may be deposited by the same sputter which has been used in operation S100 of depositing the GST layer 120 on the InGaAs substrate 110. The InGaAs/GST/Ni stacked deposition structure (FIG. 2) may be formed through operations S100 and S200 (S300).

In operation S400, thermally treating the InGaAs/GST/Ni stacked deposition structure may be performed in a specific temperature range for a given time. According to an embodiment of the inventive concept, the thermal treatment may be performed at temperature equal to or higher than 250° C. and equal to or lower than 350° C. for a time equal to or longer than 20 seconds and equal to or shorter than 40 seconds. The critical significance for the thermal treatment process will be described below with reference to experimental data of FIG. 6.

In operation S500, the InGaAs/Ni—InGaAs structure 110 and 140 (FIG. 3) may be formed through thermal treatment of the InGaAs/GST/Ni stacked deposition structure. It can be seen that through the thermal treatment, GST components are distributed in a surface part of the InGaAs/Ni—InGaAs layer (see FIG. 8) and thereby contact resistance is reduced due to the GST components (see FIG. 9). According to the InGaAs/Ni—InGaAs, it may be permissible to secure more dopants (see FIG. 10).

Hereafter, the arrangement and feature of the stacked structure generated through the aforementioned operations will be described in detail.

Figure 4:
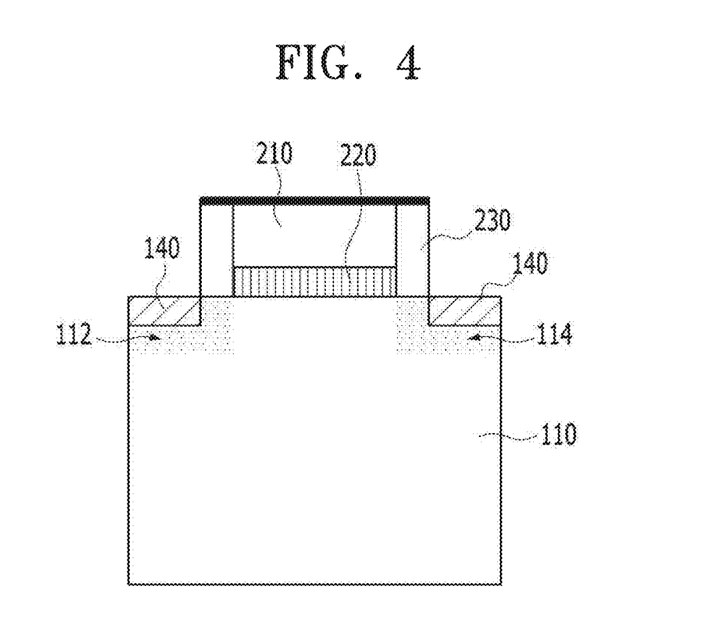
FIG. 4 is a schematic diagram illustrating an embodiment of an application device having an InGaAs/GST/Ni structure according to the inventive concept.

FIG. 4 is a schematic diagram illustrating an embodiment of an application device having an InGaAs/GST/Ni structure according to the inventive concept.

Referring to FIG. 4, the InGaAs/GST/Ni structure according to embodiments of the inventive concept may be applied to an application device such as Metal Oxide Semiconductor FET (MOSFET).

As shown in FIG. 4, a MOSFET may include a p-type InGaAs substrate 110, an n-type source 112, an n-type drain 114, an oxide layer 220, and a gate 210 between side walls 230. For this configuration, the InGaAs substrate 110, the source 112, and the drain 114 may be generated by applying heat to the InGaAs/GST/Ni stacked deposition structure in about 300° C. By applying heat to the InGaAs/GST/Ni stacked deposition structure, GST components may be rearranged in a surface part of the stacked deposition structure and a Ni—InGaAs may be generated.

Contact resistance may be reduced by distribution of the GST components in the surface part of the InGaAs/Ni—InGaAs layer. Additionally, the MOSFET may be improved in performance because an amount of dopants increases during the heating process.

A substrate manufacturing method under a condition according to an embodiment of the inventive concept will be described below as providing a quantitatively and qualitatively remarkable effect by referring detailed experimental data from FIGS. 5 to 7. The GST layer may be formed of $Ge_XSb_YTe_Z$ where X, Y, and Z may be integers equal to or larger than 1 and equal to or smaller than 50. The GST layer may be $Ge_2Sb_2Te_5$.

According to embodiments of the inventive concept, the GST layer and the Ni layer have thicknesses ranged equal to or larger than 1 nm and equal to or smaller than 1,000 nm. In this embodiment, it may be preferred for the GST layer to have a thickness about 5 nm and for the Ni layer to have a thickness about 15 nm.

Figure 5:
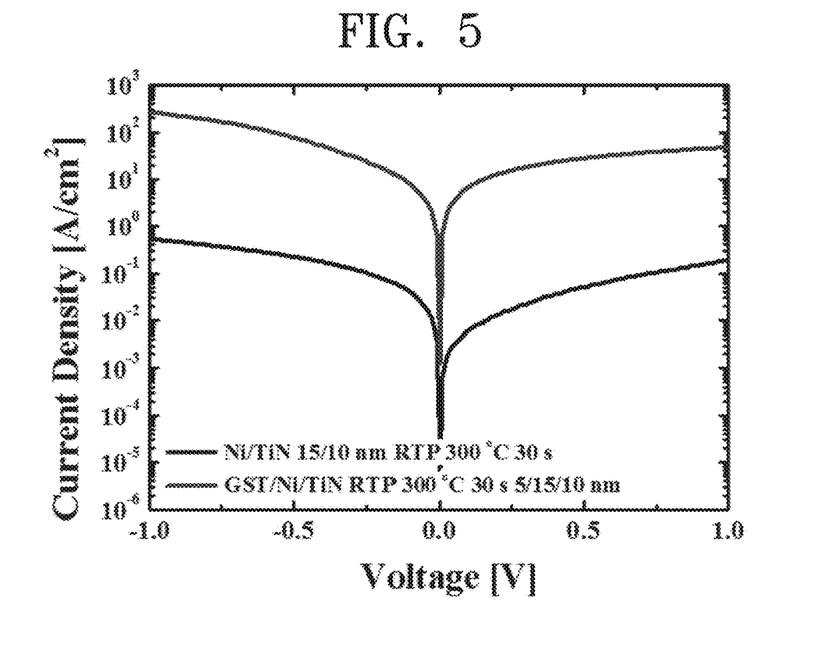
FIG. 5 is a graph showing current density values corresponding to presence/absence of a GST layer.

Referring to FIG. 5, it can be seen that the performance of the substrate is variable by presence/absence of the GST layer.

In the case of thermal treatment at 300° C. for 30 seconds, a GST layer included substrate may have current density that is about 100 times of a GST layer excluded substrate. Namely, it can be seen that in the case of thermal treatment with application of the GST layer to a substrate, the substrate is more improved with a remarkable effect than a general substrate.

In the case of applying the GST layer under the thermal treatment condition by using the difference of current density in about 100 times, it can be seen that there is a remarkable effect that could not been ever expected by general artisans skilled in the art.

Figure 6:
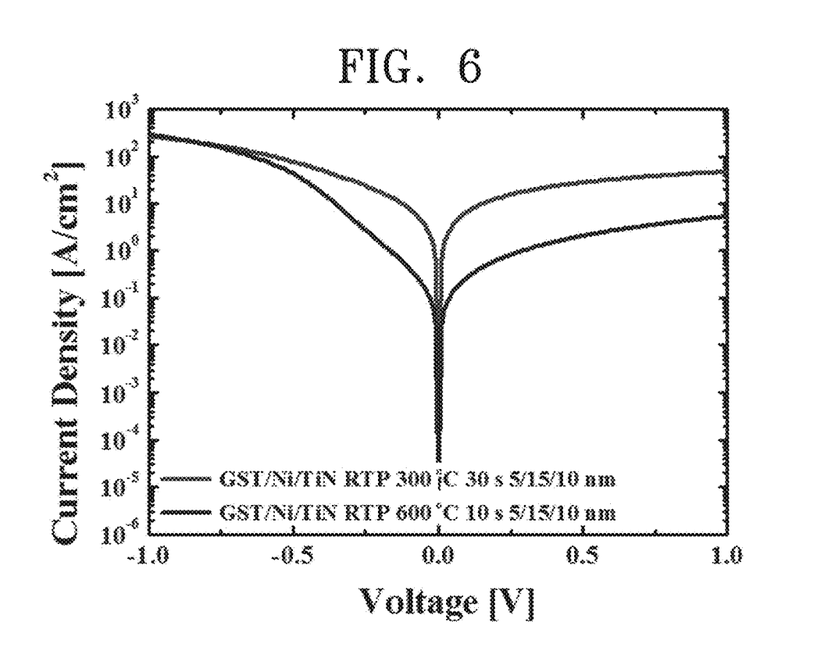
FIG. 6 is a graph showing current density values corresponding to temperature of thermal treatment.

Referring to FIG. 6, it can be seen that in the case of thermal treatment with temperature higher than 300° C., a performance improving effect of the substrate is degraded.

Figure 7:
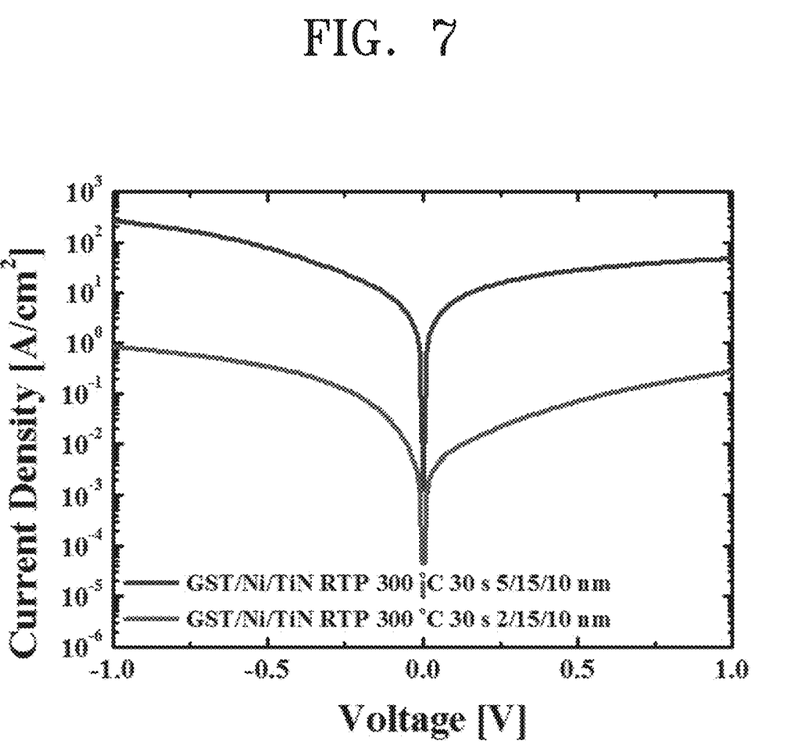
FIG. 7 is a graph showing current density values corresponding to thickness of a GST layer.

FIG. 7 is a graph showing current density values corresponding to thickness of a GST layer.

Referring to FIG. 7, it can be seen that the performance of the substrate is variable corresponding to a variation of thickness of the GST layer.

As shown in FIG. 7, the current density is reduced by about 100 times in the case that the GST layer has a thickness of 2 nm than in the case that the GST layer has a thickness of 5 nm, and the current density during this is similar to that of the case without the GST layer. Accordingly, it can be seen that an excessively thin GST layer does not have the GST layer effect and the GST layer effect is clearly shown in the case that the GST layer has a thickness at least about 5 nm.

Figure 8:
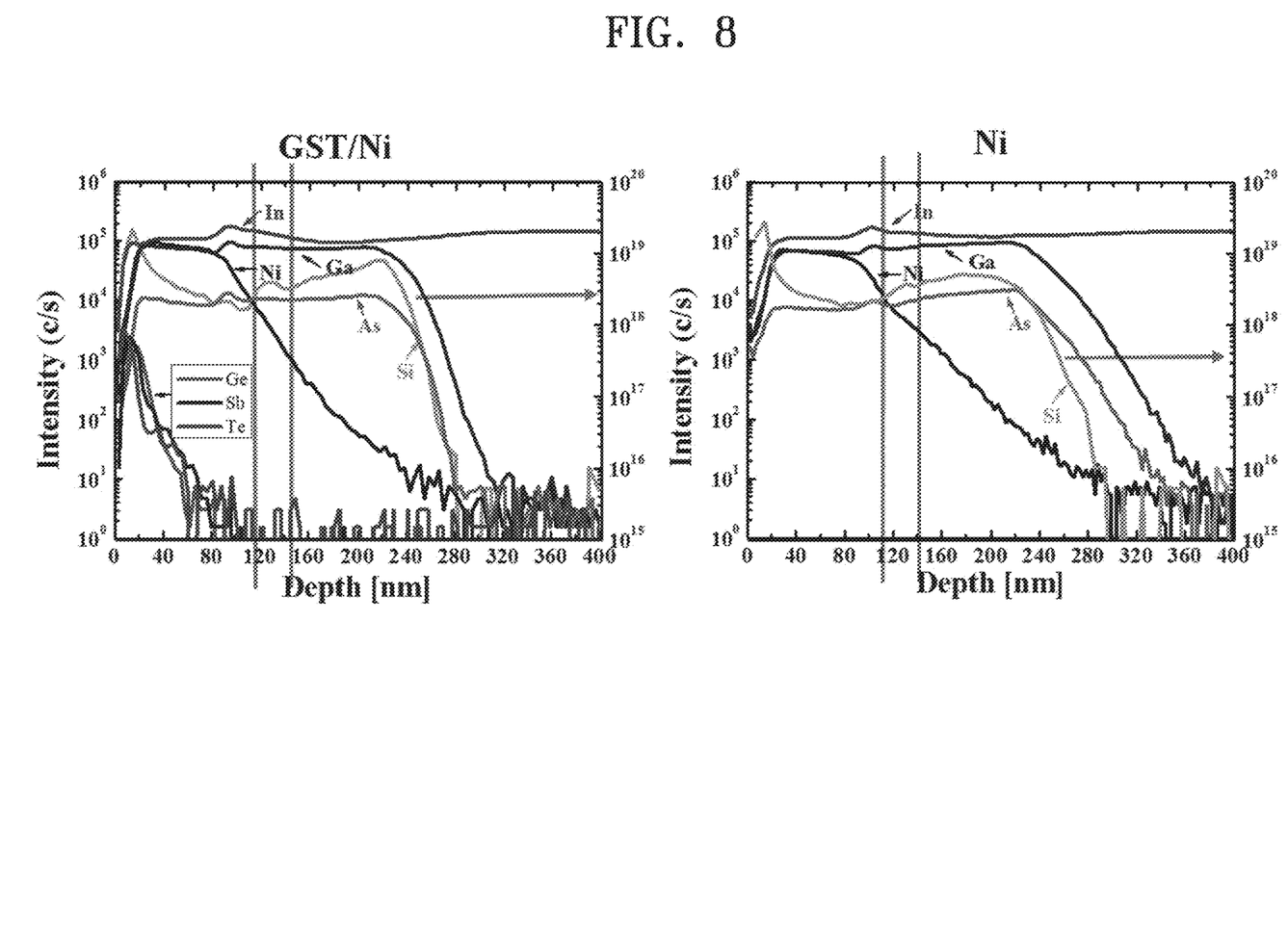
FIG. 8 shows graphs plotting distributions of respective components after thermal treatment of a stacked structure.

FIG. 8 shows graphs plotting distributions of respective components after thermal treatment of a stacked structure.

Referring to FIG. 8, it can be seen how a distribution of components of the substrate varies after the thermal treatment.

It can be seen that the case with the GST layer (the left) has a distribution of components of the Ni—InGaAs alloy similar to that of the case without the GST layer (the right). In other words, the components, Ni, In, Ga, and As, are distributed in similar rates corresponding to a depth of the stacked structure.

Meantime, it can be seen that the components of the GST layer, which are arranged under the Ni layer, are rearranged in the surface part of the Ni—InGaAs alloy. The surface part may mean a depth with peak distributions of Ge, Sb, and Te, that is, a depth from the surface of the stacked structure to 30 nm.

Referring to FIG. 8, it can be seen that the GST components corresponding to the peak distributions occupy an amount equal to or larger than about 2% of an amount of components of the Ni—InGaAs alloy.

FIG. 8 is provided for finding that the GST components are rearranged when the thermal treatment is performed under the same condition with FIG. 5, and it can be seen that there is a reasonable effect variation as like FIG. 5 because the GST components are distributed in the surface part of the stacked structure.

Figure 9:
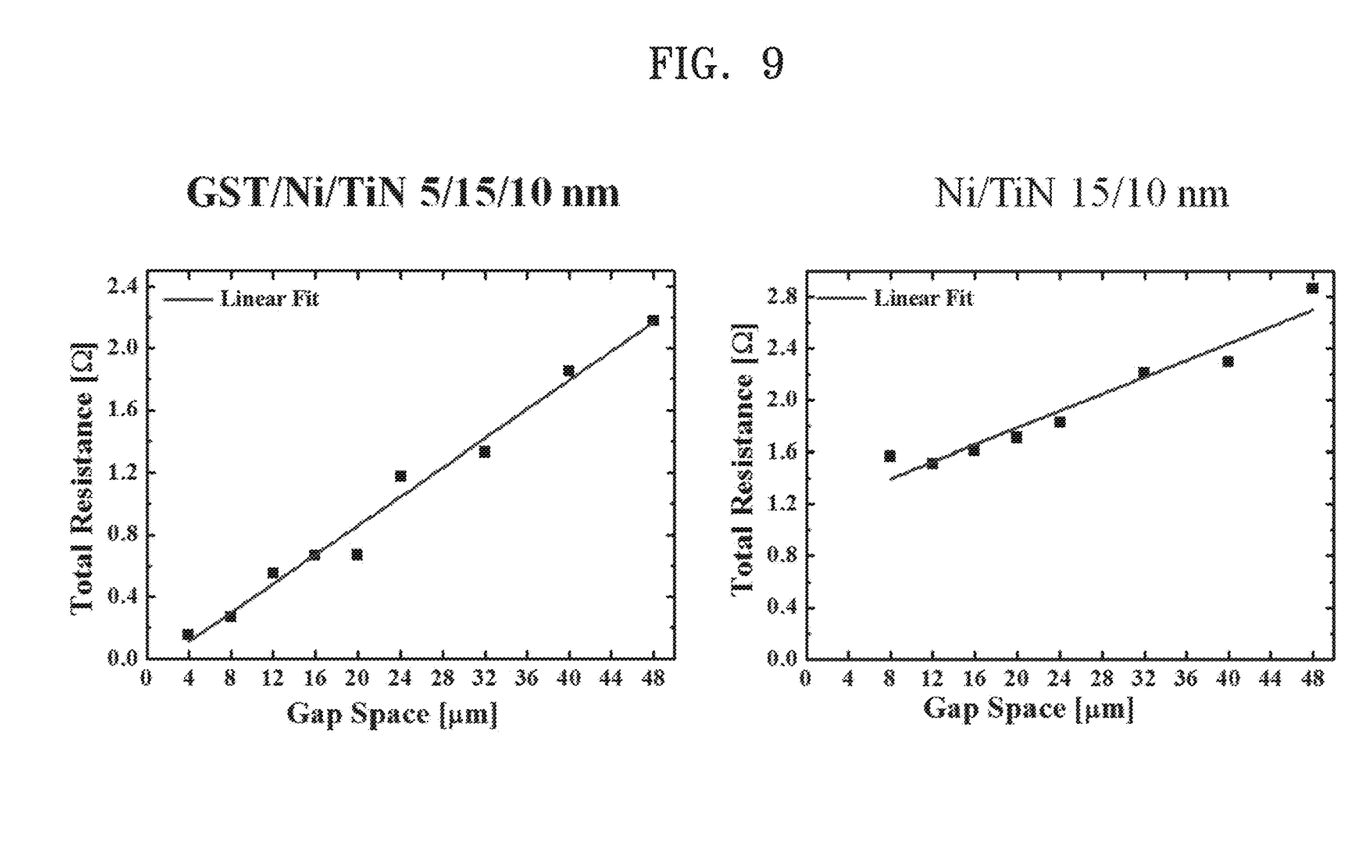
FIG. 9 shows graphs plotting contact resistance variations corresponding to presence/absence of a GST layer.

FIG. 9 shows graphs plotting contact resistance variations corresponding to presence/absence of a GST layer.

Referring to FIG. 9, it can be seen that contact resistance is reduced when thermal treatment is performed under the same condition with FIG. 5.

FIG. 9 shows a result of extracting contact resistance through a CTLM method. As shown in FIG. 9, the case with the GST layer has a contact resistance value about $1.01 \times 10^{-7}$ $\Omega cm^2$ while the case without the GST layer has a contact resistance value about $3.10 \times 10^{-5}$ $\Omega cm^2$. It can be seen that the contact resistance of the case with the GST layer is reduced to about 1/300.

Figure 10:
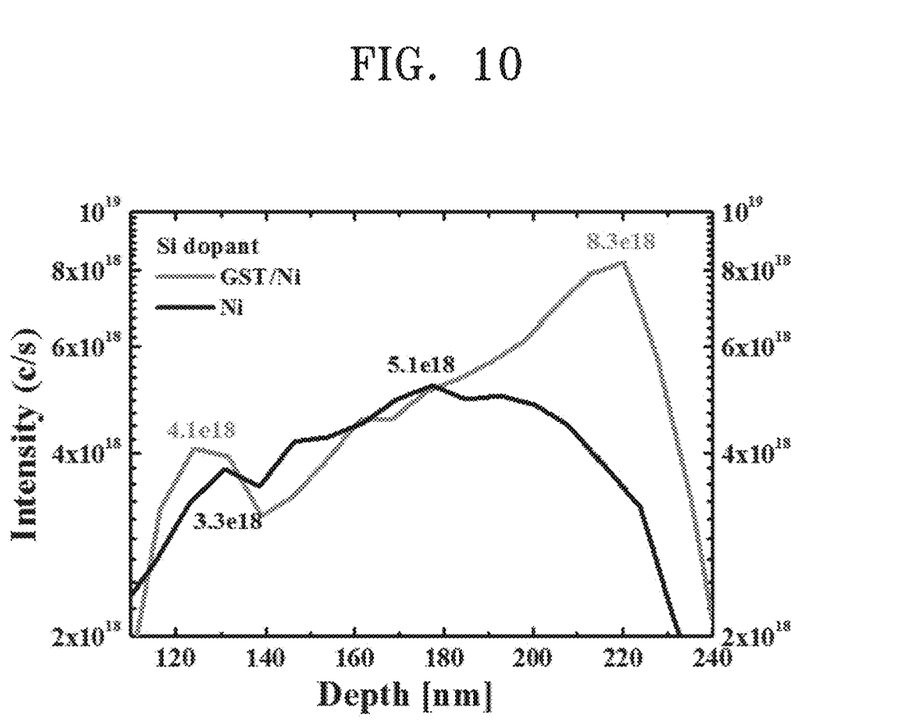
FIG. 10 is a graph showing variations of dopant amounts after employing a GST layer.

FIG. 10 is a graph showing variations of dopant amounts after employing a GST layer.

Referring to FIG. 10, it can be seen that the InGaAs layer has higher doping concentration after applying the GST layer, and has more dopants by about 28% than that of a substrate without the GST layer.

According to the contact resistance reducing method configured as aforementioned, the Ni—InGaAs alloy may be generated through the thermal treatment and during this, the components of the GST layer may be distributed in the surface part of the Ni—InGaAs alloy, thus reducing contact resistance.

Additionally, since more dopants may be secured in the case of generating the Ni—InGaAs alloy by applying the InGaAs/GST/Ni stacked deposition structure, it may be possible to improve the performance of a semiconductor device.

According to embodiments of the inventive concept, a method for reducing contact resistance may execute thermal treatment after forming an InGaAs/GST/Ni stacked deposition structure. A Ni—InGaAs alloy may be generated through the thermal treatment. During this, the contact resistance may be reduced by forcing components of a GST layer to be distributed in a surface part of the Ni—InGaAs alloy.

Additionally, according to embodiments of the inventive concept, a method for reducing contact resistance may be helpful in having a larger amount of dopants in the case of generating a Ni—InGaAs alloy by applying an InGaAs/GST/Ni stacked deposition structure, through which it may be possible to improve the performance of semiconductor devices.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for reducing contact resistance, the method comprising:
   depositing a GST layer on an InGaAs substrate;
   generating an InGaAs/GST/Ni stacked structure by depositing a Ni layer on the GST layer; and
   thermally treating the stacked structure to rearrange components of the GST layer and to generate a Ni—InGaAs alloy.

2. The method of claim 1, wherein the thermally treating of the stacked structure comprises thermally treating the stacked structure to distribute the components of the GST layer with the highest value in a depth equal to or narrower than 30 nm from a surface of the stacked structure.

3. The method of claim 2, wherein the thermally treating of the stacked structure comprises thermally treating the stacked structure to make the components of the GST structure occupy an amount equal to or larger than 2% of an amount of other components in a depth equal to or narrower than 30 nm from the surface of the stacked structure.

4. The method of claim 3, wherein the thermally treating of the stacked structure comprises thermally treating the stacked structure for a time equal to or longer than 20 seconds and equal to or shorter than 40 seconds at temperature equal to or higher than 250° C. and equal to or lower than 350° C.

5. The method of claim 2, wherein the GST layer is formed of $Ge_2Sb_2Te_5$.

6. The method of claim 2, wherein the GST layer is formed of $Ge_XSb_YTe_Z$ where X, Y, and Z are integers equal to or larger than 1 and equal to or smaller than 50.

7. The method of claim 5, wherein the GST layer has a thickness equal to or larger than 3 nm and equal to or smaller than 7 nm.

8. The method of claim 7, wherein the Ni layer has a thickness equal to or larger than 12 nm and equal to or smaller than 18 nm.

9. The method of claim 5, wherein the GST layer and the Ni layer have thicknesses equal to or larger than 1 nm and equal to or smaller than 1,000 nm.

10. The method of claim 8, wherein the thicknesses of the GST layer and the Ni layer are formed in a ratio of 1:3.

11. The method of claim 9, wherein the thicknesses of the GST layer and the Ni layer are formed in a ratio of 1:3.

* * * * *